(12) United States Patent
Arreghini et al.

(10) Patent No.: US 11,107,529 B2
(45) Date of Patent: Aug. 31, 2021

(54) MOLECULAR SYNTHESIS DEVICE

(71) Applicant: IMEC vzw, Leuven (BE)

(72) Inventors: Antonio Arreghini, Kessel-Lo (BE);
Arnaud Furnemont, Jandrenouille (BE)

(73) Assignee: IMEC vzw, Leuven (BE)

( * ) Notice: Subject to any disclaimer, the term of this patent is extended or adjusted under 35 U.S.C. 154(b) by 18 days.

(21) Appl. No.: 16/365,504

(22) Filed: Mar. 26, 2019

(65) Prior Publication Data

US 2019/0295644 A1    Sep. 26, 2019

(30) Foreign Application Priority Data

Mar. 26, 2018  (EP) ..................... 18163992

(51) Int. Cl.
*G11C 13/02* (2006.01)
*G11C 11/22* (2006.01)
(Continued)

(52) U.S. Cl.
CPC ............ *G11C 13/02* (2013.01); *G11C 11/223* (2013.01); *G11C 11/2275* (2013.01); *G11C 13/0014* (2013.01); *G11C 16/0408* (2013.01); *G11C 16/0466* (2013.01); *G11C 16/10* (2013.01); *G11C 16/14* (2013.01); *H01L 27/11556* (2013.01); *H01L 27/11582* (2013.01);
(Continued)

(58) Field of Classification Search
CPC ... G11C 13/02; G11C 13/0014; G11C 11/223; G11C 11/2275; G11C 16/0408; G11C 16/0466; G11C 16/10; G11C 16/14; G11C 16/0483; G11C 16/08; G11C 16/107; G11C 16/24
See application file for complete search history.

(56) References Cited

U.S. PATENT DOCUMENTS 6,100,026 A    8/2000 Nova et al.
6,449,188 B1   9/2002 Fastow
(Continued)

FOREIGN PATENT DOCUMENTS

KR    2000-0013508 A    3/2000
WO    WO 2001/15800 A1  3/2001
(Continued)

OTHER PUBLICATIONS

Extended European Search Report dated Oct. 10, 2018 for European Patent Application No. 18163992.3.

*Primary Examiner* — Mohammed A Bashar
(74) *Attorney, Agent, or Firm* — Knobbe, Martens, Olson & Bear LLP

(57) ABSTRACT

The disclosed technology relates to a molecular synthesis device. In one aspect, the molecular synthesis device comprises a synthesis array having an array of synthesis locations and an electrode arranged at each synthesis locations. The molecular synthesis device further comprises a non-volatile memory having an array of bit cells and a set of wordlines and a set of bitlines. Each bit cell comprises a non-volatile memory transistor having a control gate connected to a wordline, a first source/drain terminal, and a second source/drain terminal connected to a bitline. The electrode at each synthesis locations of the synthesis array is connected to the first source/drain terminal of a corresponding bit cell of the non-volatile memory.

22 Claims, 3 Drawing Sheets

(51) Int. Cl.
  *G11C 16/04* (2006.01)
  *G11C 16/10* (2006.01)
  *G11C 16/14* (2006.01)
  *H01L 27/11556* (2017.01)
  *H01L 27/11582* (2017.01)
  *H01L 27/11597* (2017.01)
  *H01L 29/788* (2006.01)
  *G11C 13/00* (2006.01)
  *G11C 16/06* (2006.01)
  *C25B 9/17* (2021.01)

(52) U.S. Cl.
  CPC .... *H01L 27/11597* (2013.01); *H01L 29/7883* (2013.01); *B01J 2219/00283* (2013.01); *B01J 2219/00511* (2013.01); *B01J 2219/00626* (2013.01); *B01J 2219/00653* (2013.01); *B01J 2219/00659* (2013.01); *C25B 9/17* (2021.01); *G11C 11/225* (2013.01); *G11C 13/0019* (2013.01); *G11C 16/06* (2013.01)

(56) References Cited

U.S. PATENT DOCUMENTS

| | | | |
|---|---|---|---|
| 9,007,836 B2 * | 4/2015 | Shirakawa | G11C 29/789 365/185.17 |
| 2009/0255801 A1 | 10/2009 | Haas | |
| 2011/0128779 A1 | 6/2011 | Redaelli et al. | |
| 2017/0053906 A1 * | 2/2017 | Or-Bach | H01L 27/11578 |

FOREIGN PATENT DOCUMENTS

| | | | |
|---|---|---|---|
| WO | WO 2004/099107 A2 | 11/2004 | |
| WO | WO 2005/073976 A1 | 8/2005 | |
| WO | WO 2010/009083 A1 | 1/2010 | |
| WO | WO-2018144957 A1 * | 8/2018 | ........ H01L 29/40117 |

* cited by examiner

MOLECULAR SYNTHESIS DEVICE

CROSS-REFERENCE TO RELATED APPLICATIONS

This application claims foreign priority to European Application EP 18163992.3, filed on Mar. 26, 2018, which is incorporated herein by reference in its entirety.

BACKGROUND

Technological Field

The disclosed technology relates to a molecular synthesis device, and a method of controlling a molecular synthesis device.

Description of the Related Technology

Each year the amount of data being generated increases. Since this trend is likely to continue, it will become increasingly challenging to store the ever increasing amount of data in a reliable and cost-effective manner. Indeed, traditional storage media such as hard disk drives, solid state drives, optical recording media, magnetic recording media, etc., may not be able to meet future data storage demands.

This concern has spurred interest in alternative data storage solutions, among others, molecular memories. A molecular memory may include an array of molecular memory cells allowing data storage in a molecular storage medium.

Various techniques of data storage in a molecular storage medium are being investigated. One promising data storage technique is a molecular synthesis-based approach where stable organic molecules (such as polymers, DNA or RNA) are synthesized in a structured manner to form molecules mapping to data symbols. Being aware of the data encoding scheme employed during writing, i.e. the mapping between data symbols and the building structures of the synthesized molecules, the written data symbols may, accordingly, be read-out from the structure of the synthesized molecules, e.g. the sequence of monomers (for polymers) or base pairs (for DNA or RNA).

Molecular synthesis may be performed in a synthesis array comprising an array of synthesis locations. To enable large capacity molecular memories with a sufficient data throughput, it is envisaged that arrays on the order of millions, billions, or even greater may be employed. Each synthesis location of the array may include a reaction or synthesis compartment. Reagents for the synthesis may be supplied to the synthesis locations by means of valves and channels, such as microfluidic channels. Subsequently, a synthesizing chemical reaction may be enabled by controlling an electrode arranged at each synthesis location. The electrodes may, for instance, supply thermal energy, generate bubbles or generate ions in the synthesis compartment, to enable the chemical reaction.

SUMMARY OF CERTAIN INVENTIVE ASPECTS

It is desirable to allow control over electrodes of a synthesis array such that the electrodes are selectively and individually activated. However, as realized by the inventors, for very large synthesizing arrays (e.g. synthesis arrays having a billion memory cells/synthesis locations or more, for the purpose of enabling molecular memories), providing a dedicated supply line to activate each electrode may not be practical.

An objective of the disclosed technology is to address this issue. Further objectives may be understood from the following.

A first aspect of the disclosed technology relates to a molecular synthesis device comprising: a synthesis array having an array of synthesis locations and an electrode arranged at each synthesis location; and a non-volatile memory having an array of bit cells, a set of wordlines, and a set of bitlines. Each bit cell comprises a non-volatile memory transistor having a control gate connected to a wordline, a first source/drain terminal, and a second source/drain terminal connected to a bitline. The electrode at each synthesis location of the synthesis array is connected to the first source/drain terminal of a corresponding bit cell of the non-volatile memory.

The first aspect of the disclosed technology is based on the insight that connecting the electrode of each synthesis location of the synthesis array to the first/source/drain terminal of the memory transistor of a corresponding bit cell of the non-volatile memory enables individual control of the electrodes while obviating the need for a dedicated and individually controllable line to each electrode.

More specifically, the disclosed device enables a pattern corresponding to a selection of synthesis locations of the synthesis array in which a chemical synthesis reaction is to be enabled to be programmed/stored in the array of bit cells of the non-volatile memory. The electrodes of the synthesis array may thereafter be activated/enabled (i.e. driven or biased) in accordance with the stored pattern using a technique resembling read-out of the non-volatile memory.

Owing to the design of the bit cells of the non-volatile memory, voltages may be supplied simultaneously to the electrode at each synthesis location. This allows a synthesis reaction to be enabled in each of a plurality of synthesis locations in parallel. Hence, the disclosed device may support an overall greater degree of parallelism, compared to a serial/sequential activation of the electrodes. Considering that some synthesis reactions usable for data storage purposes may have a reaction time being on the order of seconds, it may be understood that a parallel approach may considerably improve the feasibility of molecular memories with millions or billions of memory cells.

A bit cell comprising a non-volatile memory transistor further enables forming the bit cells with a cell size matching or being smaller than the size of synthesis locations of synthesis arrays (for instance on the order of one or a few hundred nanometers). In other words, the lower scaling limit of the bit cell size need not be a factor limiting the downscaling of the synthesis locations of the synthesis array.

Reference to a synthesis array comprising an array of synthesis locations herein means an array of synthesis locations (i.e. synthesis spots), each location being adapted to allow a molecular synthesis at the location. Each synthesis location may comprise a synthesis compartment. The synthesis compartment may be adapted to comprise a molecular synthesis medium, for instance, in liquid form. The synthesis compartment may be adapted to comprise a liquid solution including reagents for a synthesis reaction.

The synthesis array may comprise fluidic channels (e.g. microfluidic channels) connected with a synthesis compartment of each synthesis location. The fluidic channels may be adapted to forward liquids to the synthesis compartments. The synthesis array may comprise reagent compartments, each one comprising one or more reagents and each being connected to the synthesis compartments via one of the fluidic channels. The synthesis device may comprise a synthesis controller configured to control forwarding of liquids from the reagent compartments to the synthesis compartments of the synthesis array.

The electrode at each synthesis location may be configured to control a reaction condition at the corresponding synthesis location. The electrode at each synthesis location may be configured to, in response to being activated, enable or inhibit a chemical reaction in the molecular synthesis medium. The molecular synthesis medium of each synthesis location (and any reagents supplied to the synthesis locations) may be such that a chemical reaction will be inhibited (i.e. will not occur) unless the associated electrode is activated. Alternatively, the molecular synthesis medium of each synthesis location may be such that a chemical reaction will be enabled (i.e. will occur) unless the associated electrode is activated. In other words, an electrode may depending on the particular type of synthesis either be configured to enable the reaction or inhibit the reaction when being activated.

Reference to "activating" an electrode herein means supplying the electrode with a current or voltage via the bit line. The voltage may be of such a magnitude that the chemical reaction is enabled or inhibited, as the case may be.

The electrode at each synthesis location may be arranged in contact with the synthesis compartment of the synthesis location, in particular in contact with the molecular synthesis medium. The contact may be a thermal contact, wherein the electrode may supply thermal energy to the molecular synthesis medium. The contact may be an electrical capacitive contact, wherein the electrode may bias the molecular synthesis medium. The contact may be a galvanic or physical contact, wherein the electrode may supply charge carriers to the molecular synthesis medium, or generate ions in the molecular synthesis medium, or generate bubbles in the molecular synthesis medium (if in liquid phase).

Reference to non-volatile memory transistor herein means a transistor with a programmable/controllable threshold voltage which may persist even after power cycling. Accordingly, a binary value of a bit may be stored in a non-volatile manner in the memory transistor by setting the threshold voltage to either a first threshold voltage and a second threshold voltage, the second threshold voltage being higher than the first threshold voltage. For conciseness, the first threshold voltage and the second threshold voltage may, in the following, be referred to as the low threshold voltage and the high threshold voltage, respectively.

The molecular synthesis device may comprise a controller configured to: receive a data set indicating which electrodes of the synthesis array are to be enabled; set the memory transistors of each bit cells of the array of bit cells, connected to electrodes to be enabled (according to the data set), to the low threshold voltage and set the memory transistors of all other bit cells to the high threshold voltage; and apply a control voltage, intermediate between the low and the high threshold voltages, to the wordlines and an electrode voltage to the bitlines.

Accordingly, for each synthesis location in which the electrode is to be enabled, the memory transistor which is connected to the electrode may be set to the low threshold voltage. For each synthesis location in which the electrode is not to be enabled (i.e. not activated), the memory transistor which is connected to the electrode of may be set to the high threshold voltage.

In response to the control voltage applied to the wordlines, electrodes connected to memory transistors set to the low threshold voltage may be selectively connected to the bit line and thereby supplied with the electrode voltage. Reference to electrode voltage herein means a voltage for activating the electrode (and thereby enable or inhibit a chemical reaction in the corresponding synthesis location). Provided that the control voltage is applied to each of the wordline of the non-volatile memory simultaneously, the electrodes may be activated simultaneously, or at least substantially simultaneously.

The non-volatile memory may be configured such that bit cells arranged in a same array column are connected to a same bitline and such that bit cells of the array of the non-volatile memory arranged in a same array row are connected to a same wordline. The number of conductive lines may thus be limited.

The non-volatile memory may be a NOR flash memory. NOR flash memory is a mature non-volatile memory technology, enabling area efficient bit cells and parallel read-out.

The memory transistor of each bit cell may include either a floating gate or a charge trapping layer. A threshold voltage of a memory transistor including either a floating gate or a charge trapping layer may be programmed by controlling the amount of charge on the floating gate/charge trapping layer. Accordingly, the threshold voltage may be switched between (at least) a low threshold voltage and a high threshold voltage, as earlier discussed. As the charges are trapped on the floating gate/charge trapping layer, non-volatile operation is allowed.

The memory transistor of each bit cell may be a ferroelectric transistor. A threshold voltage of a ferroelectric transistor may be programmed by setting the polarization of a ferroelectric layer of the transistor to either one of a first state with a first orientation of polarization or a second state with a second orientation of polarization, opposite the first orientation. Accordingly, the threshold voltage may be switched between (at least) a low threshold voltage and a high threshold voltage, as earlier discussed. As the ferroelectric layer retains its polarization even in absence of an external field, non-volatile operation is allowed.

The molecular synthesis device may further comprise a substrate, wherein the non-volatile memory is formed on the substrate and the synthesis array is formed on the non-volatile memory. The synthesis array may hence be stacked on top of the non-volatile memory. This allows an area efficient device design as well as facilitates interconnecting of bit cells of the non-volatile memory and the synthesis locations of the synthesis array.

Each memory transistor may comprise a vertical channel formed in a semiconductor structure protruding vertically from the substrate, and wherein the first source/drain terminal of each memory transistor is arranged above the vertical channel. The memory transistors may accordingly be formed as 3D devices, thus enabling a further relaxation of scaling requirements for the bit cells.

Alternatively, each memory transistor may comprise a horizontal channel extending horizontally along the substrate.

The electrode at each synthesis location may be connected to the first source/drain terminal of the corresponding bit cell of the non-volatile memory by a corresponding via. Vertical conductive vias may provide an area- and material-efficient interconnection between bit cells and synthesis locations. Vias may be reliably formed by conventional back-end-of-line (BEOL) processing, on top of the non-volatile memory device. Interconnection may be especially straightforward, provided that the memory transistors form 3D devices as set out above; wherein the first source/drain terminal is accessible above the second source/drain terminal and the control gate.

A second aspect of the disclosed technology relates to a method of selectively activating electrodes of an array of synthesis locations, wherein the electrode of each synthesis location is connected to a first source/drain terminal of a non-volatile memory transistor of a corresponding bit cell of an array of bit cells of a non-volatile memory device, and wherein the memory transistor of each bit cell is switchable between a low threshold voltage and a high threshold voltage and has a control gate connected to a wordline of a set of wordlines of the non-volatile memory device and a second source/drain terminal connected to a bitline of a set of bitlines of the non-volatile memory device, the method comprising: setting the memory transistors of each bit cells, connected to electrodes which are to be activated, to the low threshold voltage and the memory transistors of all other bit cells to the high threshold voltage; and applying a control voltage, intermediate between the low and the high threshold voltages, to the wordlines and an electrode voltage to the bitlines.

As discussed above, the disclosed method enables individual and selective control over at which locations in the synthesis array a chemical reaction is to be enabled or inhibited. Moreover the method enables, in line with the above discussion, the electrodes to be activated simultaneously.

The non-volatile memory may be a NOR flash memory wherein the method comprises: performing a Fowler-Nordheim tunneling erase on each bit cells of the non-volatile memory where the memory transistors of the bit cells are set to the low threshold voltage; and setting the memory transistors of all other bit cells to the high threshold voltage by Fowler-Nordheim tunneling or channel hot electron injection.

This enables reliable and efficient programming of a NOR-flash type of non-volatile memory. Fowler-Nordheim tunneling may be an advantageous programming method if the electrodes of the synthesis array present a relatively high impedance. Channel hot electron injection represents a programming method which may be employed if the electrodes of the synthesis array present a relatively low impedance.

BRIEF DESCRIPTION OF THE DRAWINGS

The above, as well as additional objectives, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
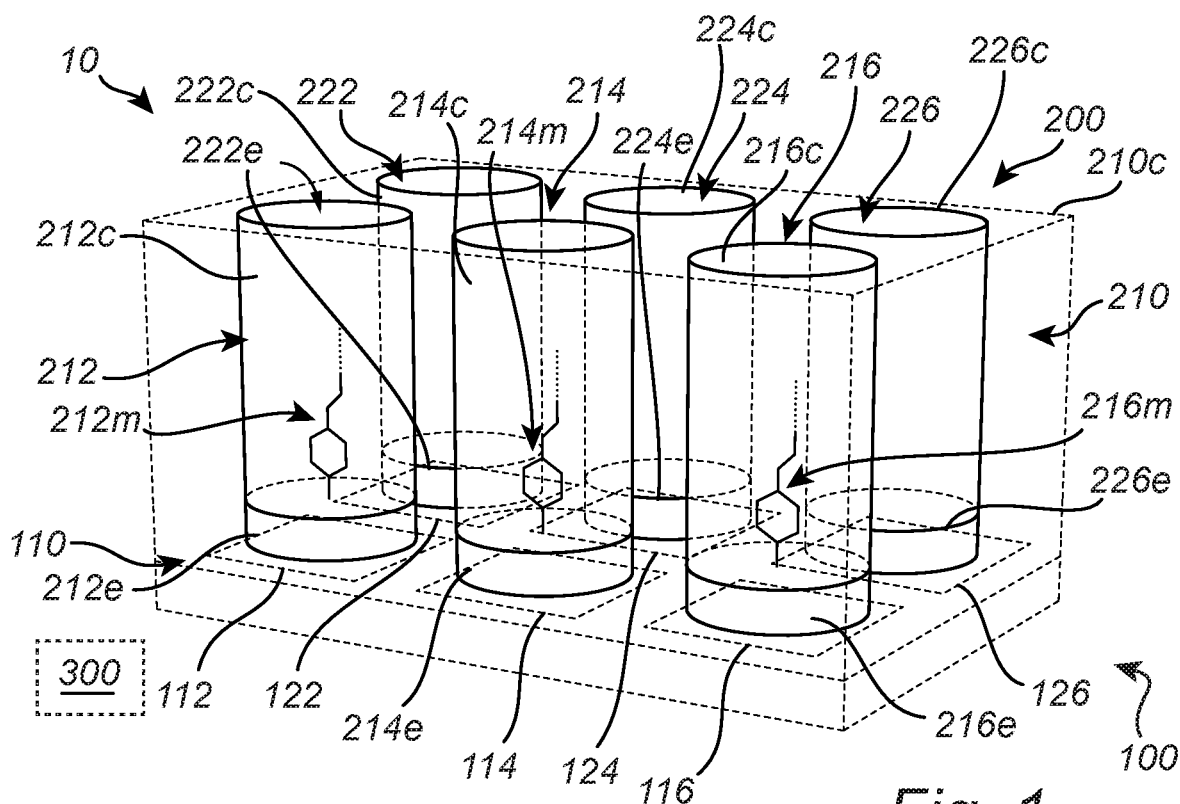
FIG. 1 is a schematic perspective view of a molecular synthesis device.

FIG. 1 schematically illustrates a molecular synthesis device 10 comprising a non-volatile memory 100 and a synthesis array 200.

The non-volatile memory (NVM) 100 comprises an array 110 of bit cells 112, 114, 116, 122, 124, 126. The synthesis array 200 comprises an array of synthesis locations 212, 214, 216, 222, 224, 226 (commonly referenced 210). In FIG. 1 only six bit cells and synthesis locations are visible, however this would typically represent only a small part of the device 10 comprising bit cell arrays and synthesis arrays of much greater sizes.

Figure 2:
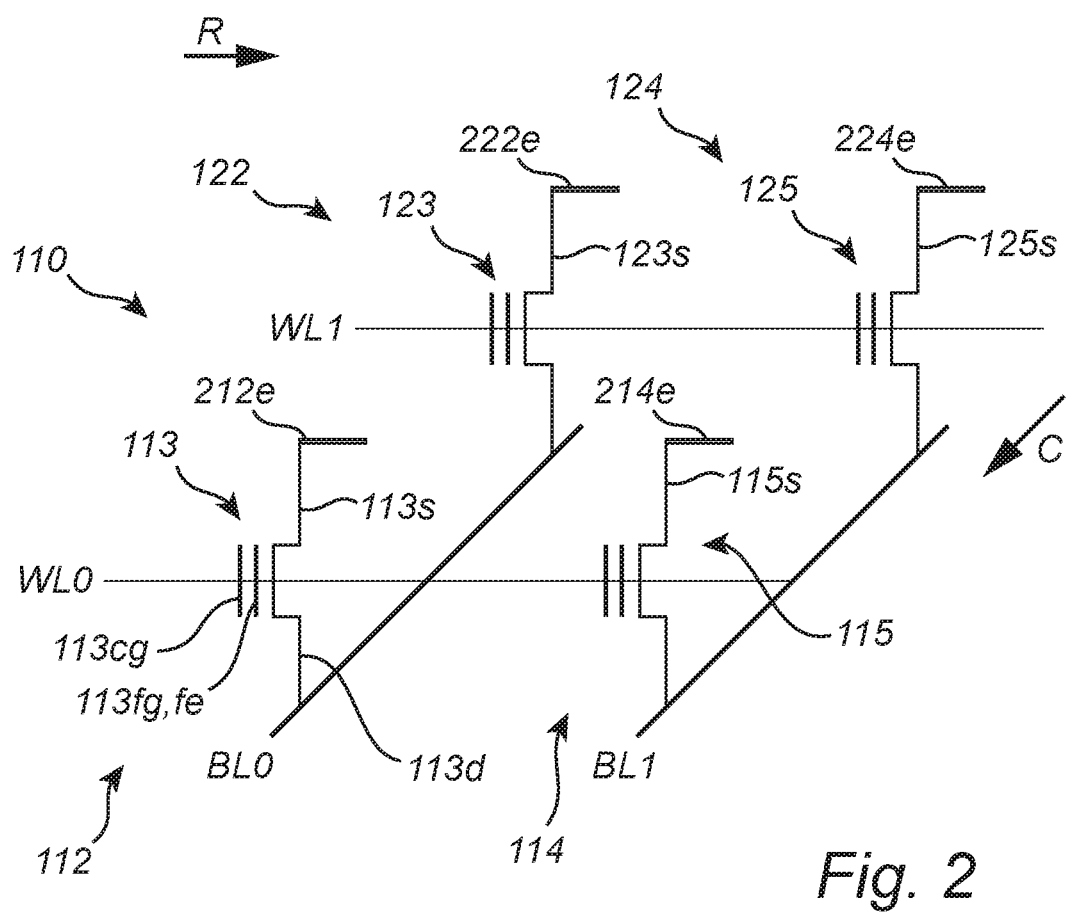
FIG. 2 is a schematic circuit layout of bit cells of a non-volatile memory.

FIG. 2 shows a circuit layout of a portion of the array 110 including bit cells 112, 114, 122, 124. The NVM 100 is configured as a NOR flash memory. Each bit cell of the array 110 comprises a corresponding non-volatile memory transistor 113. Reference is in the following made to the memory transistor 113 of the bit cell 112 but the other bit cells of the array 110 comprise corresponding memory transistors 115, 123, and 125. The memory transistor 113 has a control gate 113$cg$, a first source/drain terminal 113$s$ (hereinafter referred to as the first terminal 113$s$) and a second source/drain terminal 113$d$ (hereinafter referred to as the second terminal 113$d$). The control gate 113$cg$ is connected to a wordline WL0. The second terminal 113$d$ is connected to a bit line BL0. The first terminal 113$s$ is connected to an electrode 212$e$ arranged at the synthesis location 212. Correspondingly, the terminal 115$s$ of the memory transistor 115 is connected to an electrode 214$e$ arranged at the synthesis location 214. The terminal 123$s$ of the memory transistor 123 is connected to an electrode 222$e$ arranged at the synthesis location 222. The terminal 125$s$ of the memory transistor 125 is connected to an electrode 224$e$ arranged at the synthesis location 224.

The memory transistor 113 may be a field-effect transistor (FET). The memory transistor 113 may as shown in FIG. 2 be a floating gate FET comprising a floating gate 113$fg$ arranged between the control gate 113$cg$ and the channel. The floating gate 113$fg$ may, for instance, be of a polysilicon or metal material. The memory transistor 113 may alternatively include an oxide- or dielectric-based charge trapping layer arranged between the control gate 113$cg$ and the channel. The charge trapping layer may, for instance, be an oxide-nitride-oxide layer, a silicon dioxide layer, a silicon nitride layer, or other defect rich dielectric. Single-layered charge trapping layers as well as composite-layered charge trapping layers are possible. As both of these memory transistor types are based on charge trapping the bit cell comprising any of these transistor types may be referred to as a charge trap bit cell.

Alternatively, the memory transistor 113 may instead be a ferroelectric FET comprising a ferroelectric layer 113$fe$ arranged between the control gate 113$cg$ and the channel. Any typical ferroelectric material suitable for a ferroelectric FET may be used. The ferroelectric layer may, for instance, be a layer of hafnium oxide (HfO2), (Pb,Zr)TiO3 or SrBi2Ta2O9.

The NVM 100 comprises a set of wordlines WL0, WL1 and a set of bitlines BL0, BL1. The wordlines may extend along a row direction R of the array 110. The bitlines may extend along a column direction C of the array 110, perpendicular to the row direction R.

As shown in FIG. 2, bit cells of the array 110 of the NVM 100 arranged in a same array column are connected to a same bitline. That is, the bit cells 112, 122 are connected to the bitline BL0. The bit cells 114, 124 are connected to the bitline BL1. Meanwhile, bit cells of the array 110 of the NVM 100 arranged in a same array row are connected to a same wordline. That is, the bit cells 112, 114 are connected to the wordline WL0. The bit cells 122, 124 are connected to the wordline WL1.

For the purpose of providing voltages and currents to wordlines and bitlines, the NVM 100 may further comprise driver circuitry including wordline drivers and bitline drivers. The device 10 may comprise a controller 300, schematically indicated in FIG. 1. The controller 300 may be configured to control the NVM 100, such as the driver circuitry. The controller 300 may form part of the NVM 100. The controller 300 may be realized by active devices formed on a same semiconductor substrate as the NVM 100.

Figures 3A, 3B:
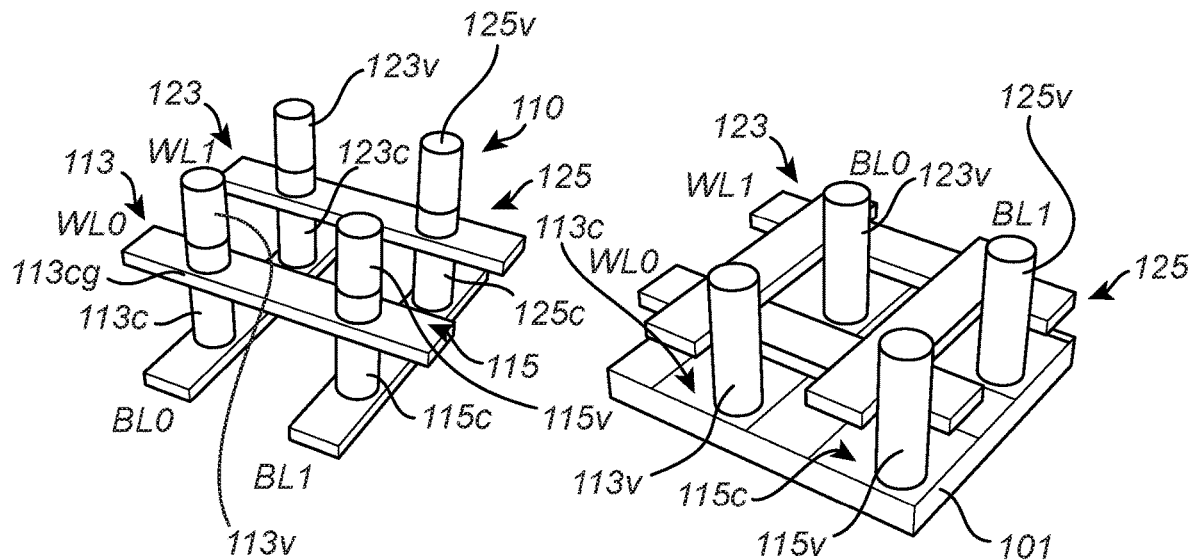
FIGS. 3A and 3B are schematic perspective views of designs of memory transistors.

With reference to FIG. 3A, the memory transistors 113, 115, 123, 125 of the NVM array 110 may be realized as vertical channel transistor devices, each comprising a vertical channel 113$c$, 115$c$, 123$c$, 125$c$ formed in a semiconductor structure protruding vertically from an underlying semiconductor substrate. A corresponding via 113$v$, 115$v$, 123$v$, or 125$v$ may be formed on top of each memory transistor 113, 115, 123, or 125 to connect each memory transistor with the corresponding electrode 212$e$, 214$e$, 216$e$, 222$e$, 224$e$, or 226$e$ of the synthesis array 200.

FIG. 3B shows an alternative design wherein each memory transistor 113, 115, 123, 125 comprises a horizontal channel exemplified by 113$c$, 115$c$, formed in a horizontally extending portion of a semiconductor substrate 101. Corresponding vias 113$v$, 115$v$, 123$v$, and 125$v$ extend from the source/drain terminals of the corresponding transistors 113, 115, 123, and 125. Memory transistors formed as FinFETs or horizontal nanowire FETs are also possible.

As shown in FIG. 1, the synthesis array 200 comprises an array of synthesis locations 212, 214, 216, 222, 224, 226. The synthesis array 200 may be provided in the form of a microarray. Each synthesis location 210 comprises a corresponding molecular synthesis medium, e.g. as indicated by 212$m$, 214$m$, 216$m$ for locations 212, 214, 216. Furthermore, an electrode 212$e$, 214$e$, 216$e$, 222$e$, 224$e$, 226$e$ is arranged at each synthesis location. As indicated in FIG. 2 for electrodes 212$e$, 214$e$, 222$e$, 224$e$, each electrode of the synthesis array 200 is connected to the first terminal of a corresponding bit cell of the array 110. Thus, there may be a one-to-one correspondence between the bit cells of the array 110 and the synthesis locations of the array 210. Advantageously, a footprint of each bit cell of the array 110 does not exceed (e.g., is less than) a footprint of the corresponding synthesis location of the array 210.

The synthesis array 200 may comprise a synthesis compartment 210$c$. The synthesis locations 210 may be arranged on a substrate surface of, for instance, glass, inside the synthesis compartment. Alternatively, each synthesis location 210 may include corresponding synthesis compartments 212$c$, 214$c$, 216$c$ adapted to contain the molecular synthesis medium 212$m$, 214$m$, 216$m$. Such individual synthesis compartments (i.e. "microwells") may be formed by cavities or depressions formed in a base substrate of, for instance, glass.

The molecular synthesis device 10 may further comprise fluidic channels (e.g. microfluidic channels) adapted to forward liquids such as reagents to the synthesis compartment(s). The device 10 may comprise reagent compartments, each one comprising one or more reagents and each being connected to the reagent compartments via one of the fluidic channels. A controller of the device 10, such as the controller 300, may control forwarding of liquids from the reagent compartments to the synthesis compartment(s) of the synthesis array 210, for instance, by controlling valves along the fluidic channels.

Regardless of whether a common synthesis compartment or individual synthesis compartments are provided, corresponding electrodes 212$e$, 214$e$, 216$e$, 222$e$, 224$e$, 226$e$ may be arranged at each synthesis locations 212, 214, 216, 222, 224, 226 of the array 210, in contact with the corresponding synthesis compartments.

Each electrodes 212$e$, 214$e$, 216$e$, 222$e$, 224$e$, 226$e$ may accordingly contact the molecular synthesis medium of the corresponding synthesis locations 212, 214, 216, 222, 224, 226. Each electrode may thereby influence the chemical environment in the molecular synthesis medium of the associated synthesis location. The electrodes 212$e$, 214$e$, 216$e$, 222$e$, 224$e$, 226$e$ may be formed of a conventional electrode material such as Al, Au, Ag, or Cu.

The synthesis array 210 may in addition to the indicated (first) electrodes 212$e$, 214$e$, 216$e$, 222$e$, 224$e$, 226$e$ comprise a second electrode arranged at each synthesis location 212, 214, 216, 222, 224, 226. The second electrode may be common to all synthesis locations 212, 214, 216, 222, 224, 226 or an individual second electrode may be provided for each synthesis locations 212, 214, 216, 222, 224, 226. The (first) electrodes 212$e$, 214$e$, 216$e$, 222$e$, 224$e$, 226$e$ and the second electrode(s) may be arranged on opposite sides of the molecular synthesis mediums 212$m$, 214$m$, 216$m$, or synthesis compartment(s) 210$c$ or 212$c$, 214$c$, 216$c$, 222$c$, 224$c$, 226$c$. The (first) electrodes 212$e$, 214$e$, 216$e$, 222$e$, 224$e$, 226$e$ and the second electrode(s) may be configured as corresponding anode-cathode pairs.

The molecular synthesis device 10 is in principle usable for any synthesis application in which synthesis at a synthesis location may be enabled or inhibited by controlling a voltage of an electrode. A molecule, such as a polymer, may be provided at each synthesis location. For instance, a molecule may be attached to a corresponding surface of a synthesis compartment at each synthesis location of the array 210, respectively. By way of example, the molecular synthesis medium may comprise a liquid solution wherein activation of an electrode through electrolysis may trigger ion formation, the ions in turn enabling or inhibiting a synthesis reaction at the synthesis location. As is known in the art, a changed ion concentration in an electrolyte such as water may influence the pH of the electrolyte. Thus, reactions sensitive to pH value may be enabled or inhibited by appropriate control of the electrode voltage. Other examples include generating bubbles or supplying thermal energy to the synthesis location by controlling the electrode voltage.

One possible synthesis reaction is polymer synthesis by click chemistry reactions. Click chemistry reactions were introduced by Sharples and co-workers in 2001 and relates to a class of small molecule reactions known to a person skilled in chemical synthesis. Homo-bifunctional monomers may be linked together using click chemistry reactions between the functional groups of the monomers. Thus, the functional groups are selected so that the monomers can be linked together using a click chemistry reaction. A homo-bifunctional monomer may comprise a core structure having identical functional groups attached at two different positions of the core structure. A desired polymer may be produced by linking together, through a click chemistry reaction, monomers selected from a group of different homo-bifunctional monomers having at least two different core structures. The core structures may, for instance, have different sterical sizes. By way of example, a monomer A may comprise a benzene moiety and a monomer B may lack a benzene moiety, i.e. A may be more "bulky" than B. The functional group of the monomer A may be an azide whereas the functional group of the monomer B may be an alkyne. A click chemistry reaction may thus be a copper catalyzed azide-alkyne cycloaddition (CuAAC) and the electrode may be used to locally transfer the copper catalyst between Cu(I)

and Cu(II), i.e. between an active Cu(I) state and an inactive Cu(II) state. More generally, the electrode of each corresponding synthesis location may be used to activate a redox-active catalyst that catalyses the click chemistry reaction between the homo-bifunctional monomers at the corresponding synthesis location.

A polymer may be attached to each synthesis location 212, 214, 216, 222, 224, 226 of the synthesis array 210, respectively. The polymers may, for instance, be attached to a surface of the corresponding electrodes 212e, 214e, 216e, 222e, 224e, 226e of the synthesis locations 212, 214, 216, 222, 224, 226. A click chemistry reaction may thereby be electro-induced at each synthesis location by controlling the voltage of the electrode at the synthesis location.

The molecular synthesis device 10 may be used for data storage applications. Digital information in the form of a set of data symbols may be encoded or stored in one or more molecules synthesized in the synthesis array 200. Each data symbol may be a one or a multi-bit symbol. A sequence of data symbols may be written in a synthesis location by sequentially synthesizing a storage molecule, in accordance with the sequence of data symbols. For each data symbol of the sequence to be stored, one or more reagents selected from a predetermined set of reagents, in accordance with the value of the symbol to be encoded, may be supplied to the synthesis compartment(s). Thereafter, a synthesis reaction may be enabled simultaneously in selected synthesis locations by selectively enabling the electrodes using the NVM 100, as will described below. To illustrate, a storage polymer may be synthesized (e.g. by click chemistry) as a chain of monomers A and B, wherein monomer A encodes a "0" of an input data sequence and a monomer B encodes a "1" of the input data sequence.

In a memory application the synthesis array 200 may be referred to as a molecular memory. The synthesis locations of the array of synthesis locations 210 may be referred to as molecular memory cells. The molecular synthesis medium of each synthesis location may be referred to as the molecular storage medium.

Methods of selectively activating electrodes of the synthesis array 200 by programming the NOR-flash NVM 100 will now be described with reference to FIGS. 4-6. The FIGS. 4-6 are schematic views of the array 110 of the NVM 100 wherein horizontal lines indicate wordlines, vertical lines indicate bitlines and circles indicate bit cells of the array 110.

Figure 4:
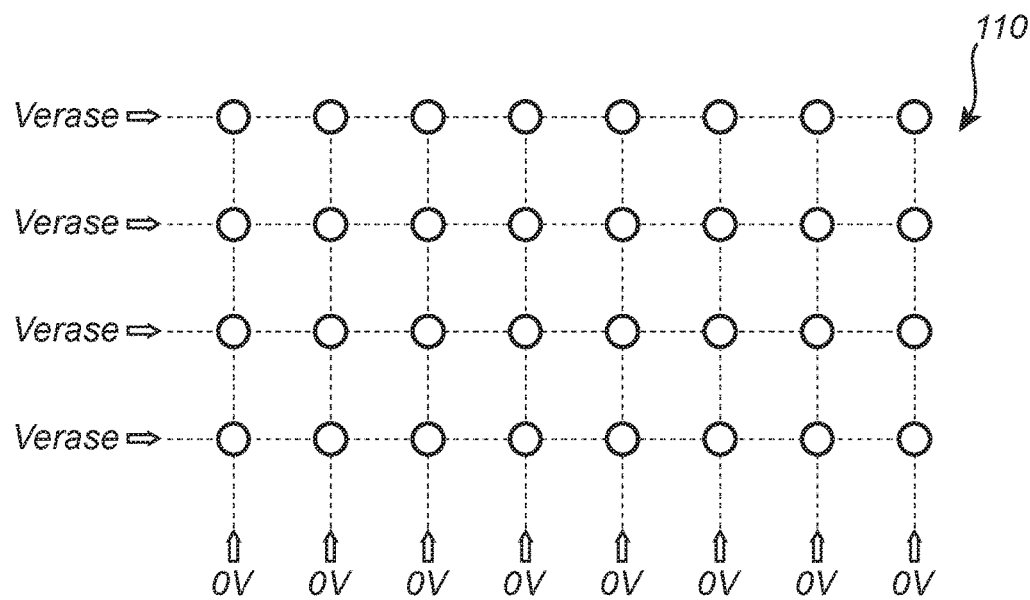
FIGS. 4-6 illustrate programming of a non-volatile memory.

In a first step shown in FIG. 4 the entire array 110 is erased by performing a Fowler-Nordheim tunneling erase of each bit cell. Thereby the memory transistor of each bit cell is set to the low threshold voltage, as indicated by the non-filled circles in the figure. The entire array 110 may be erased simultaneously or in a block-wise manner. For instance, a wordline erase control voltage Verase in the range of −10 to −14 V may be applied to the wordlines while a bitline erase control voltage of about 0 V (i.e. about ground) may be applied to the bitlines. The voltages may be applied as pulses, for instance with a duration on the order of 1-10 milliseconds.

In a second step the memory transistor of each bit cell connected to an electrode of the synthesis array 200 which is not to be activated is set to the high threshold voltage. Thereby the memory transistor of selected bit cell is set to the high threshold voltage, as indicated by the filled circles in the FIGS. 5 and 6. The programming of these bit cells to the high threshold voltage may be performed sequentially, along one wordline at a time.

Figure 5:
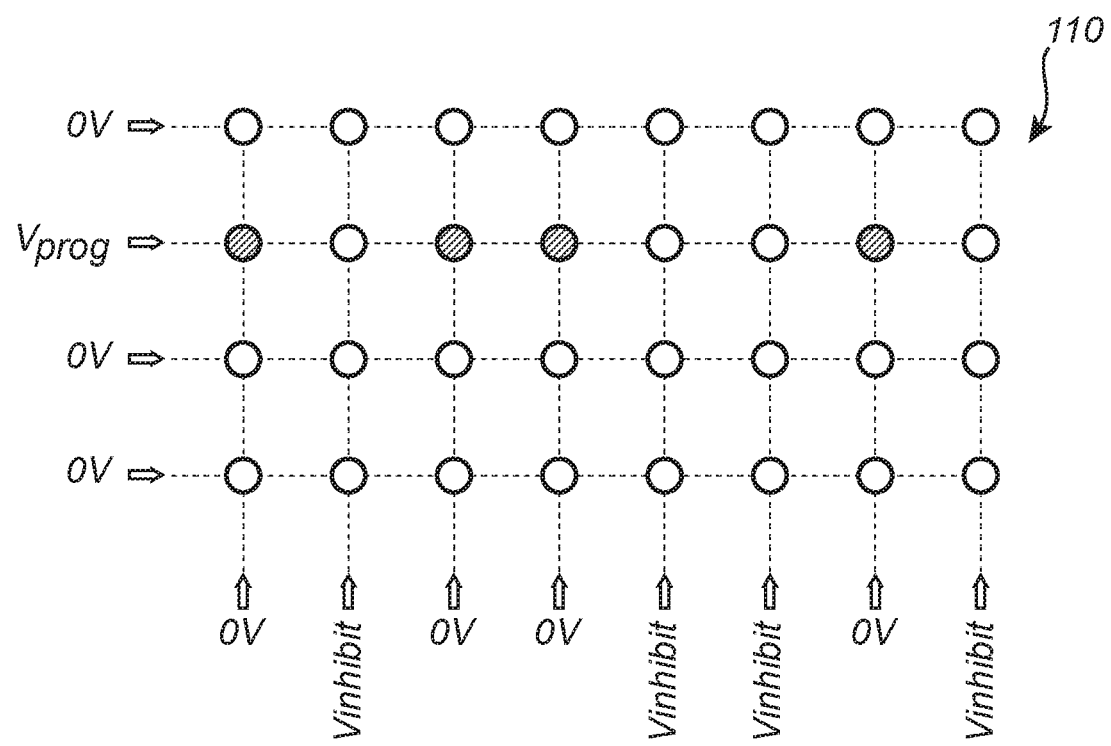
Figure 6:
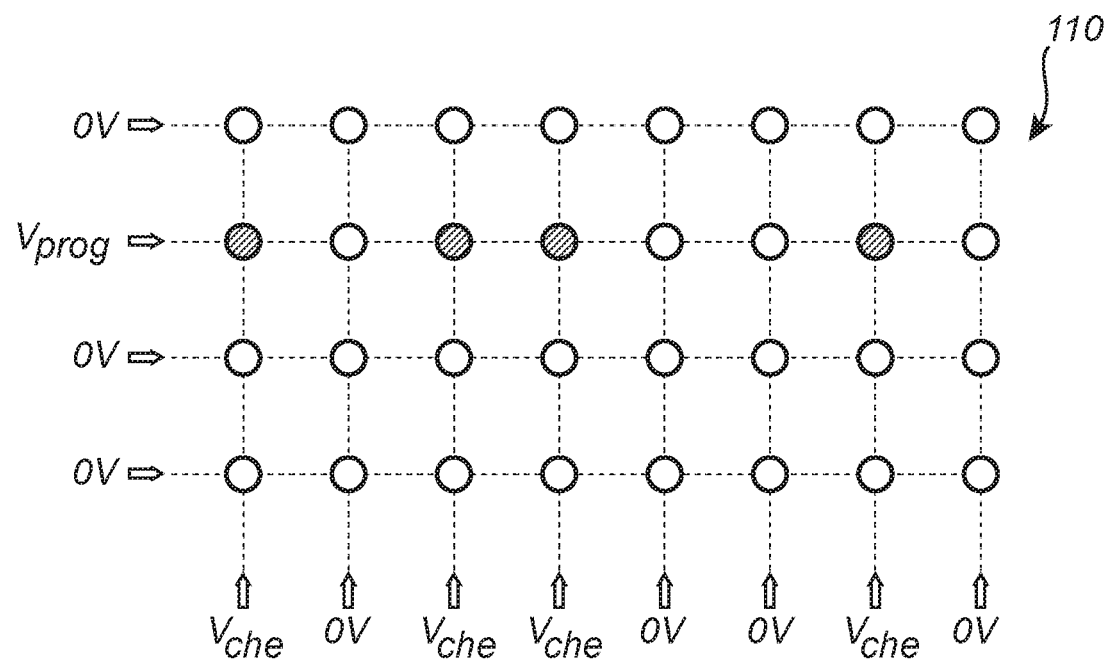

FIG. 5 illustrates programming bit cells using Fowler-Nordheim tunneling. A wordline programming voltage Vprog in the range of 10 to 14 V may be applied to the wordline connected to bit cells which are to be programmed while a bit line programming voltage of about 0 V may be applied to the associated bitlines. Programming of bit cells which are to remain in the low threshold voltage state may be inhibited by applying a bitline inhibit control voltage Vinhibit to the associated bitlines. The Vinhibit voltage may be a voltage intermediate between Vprog and 0 V. For instance, a voltage of 6 V may be sufficient to inhibit Fowler-Nordheim tunneling in a bit cell. The programming and inhibit voltages may be applied as pulses, for instance, with a duration on the order of 10-100 microseconds.

FIG. 6 illustrates programming bit cells using channel hot electron injection. A wordline programming voltage Vprog in the range of 6 to 10 V may be applied to the wordline connected to bit cells which are to be programmed while a bit line programming voltage Vche of about 3-4 V may be applied to the associated bitlines. Bit cells which are to remain in the low threshold voltage state may be supplied by a zero wordline and/or bitline voltage. The programming and inhibit voltages may be applied as pulses, for instance, with a duration on the order of 10-100 microseconds.

In use of the device 10, the controller 300 may receive a data set indicating bit cells of the NVM array 110 which are to be set to a high and a low threshold voltage state, respectively, the data set thus indicating the electrodes of the synthesis array 200 which are to be enabled. In response, the controller 300 may program the array 110 by erasing the array 110 and thereafter selectively programming bit cells by Fowler-Nordheim tunneling or channel hot electron injection, as described above.

Subsequent to programming, the electrodes may be selectively activated by applying a read control voltage, intermediate between the low and the high threshold voltages, to the wordlines and an electrode voltage to the bit lines. By way of example, a read control voltage in the range of 1-3 V may be applied, selected by taking the low and high threshold voltages into account. The magnitude of the electrode voltage may depend on the particular synthesis reaction that is to be controlled. The electrode voltage may, as a non-limiting example, be in the range of 1-5 V.

In response, bit cells in the low threshold voltage state will be switched on, thus connecting an electrode of the synthesis array 200 to a bit line and activating the electrode. Meanwhile, bit cells in the high threshold voltage state will not be switched on, thereby keeping an electrode of the synthesis array 200 disconnected from a bit line and thus keeping the electrode disabled. The wordline and bitline read control voltages may be maintained as long as is required to allow the synthesis reactions to complete. The NVM array 110 may thereafter be erased and programmed again, in accordance with a new data set received by the controller 300.

As will be appreciated by a person skilled in the art the magnitudes of the voltages and the pulse durations mentioned above merely represent non-limiting examples and the actual magnitudes will depend on the electrical properties of the memory transistors of the bit cells. Moreover, although the programming is described in connection with charge trap bit cells, bit cells including memory transistors in the form of ferroelectric FETs may be programmed in a corresponding manner by applying appropriate voltages to the wordlines and bitlines to switch the polarizations of ferroelectric FETs.

Optionally, the NVM 100 may further comprise switching circuitry (e.g., including one or more transistors) configured to switchably connect the memory transistors of the array 110 to the corresponding electrodes. The switching circuitry may be controlled by the controller 300. During programming of the array 110, the first source/drain terminals of the bit cells of the array 110 may be disconnected from their corresponding electrodes by the switching circuitry. During read-out of the array 110, the first source/drain terminals of the bit cells of the array 110 may be connected to their corresponding electrodes by the switching circuitry. Thereby, in the event that the electrode does not provide an impedance sufficiently high to allow programming by Fowler-Nordheim tunneling, the first terminals of the memory transistors may be connected to a high impedance during the bit cell programming.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A molecular synthesis device comprising:
   a synthesis array having:
      an array of synthesis locations; and
      an electrode arranged at each synthesis location;
   a non-volatile memory having:
      an array of bit cells;
      a set of wordlines; and
      a set of bitlines,
      wherein each bit cell comprises:
         a non-volatile memory transistor having a control gate connected to a wordline;
         a first source/drain terminal; and
         a second source/drain terminal connected to a bitline,
      wherein the electrode at each synthesis location of the synthesis array is connected to the first source/drain terminal of a corresponding bit cell of the non-volatile memory, and wherein the memory transistor of each bit cell is switchable between a low threshold voltage and a high threshold voltage; and
   a controller configured to:
      receive a data set indicating which electrodes of the synthesis array are to be enabled;
      set the memory transistors of each bit cell, connected to electrodes to be enabled, to the low threshold voltage and set the memory transistors of all other bit cells to the high threshold voltage; and
      apply a control voltage, intermediate between the low and the high threshold voltages, to the wordlines and an electrode voltage to the bitlines.

2. The molecular synthesis device according to claim 1, wherein bit cells of the array of the non-volatile memory arranged in a same array column are connected to a same bitline, and wherein bit cells of the array of the non-volatile memory arranged in a same array row are connected to a same wordline.

3. The molecular synthesis device according to claim 1, wherein the non-volatile memory is a NOR flash memory.

4. The molecular synthesis device according to claim 1, wherein the memory transistor of each bit cell includes a floating gate or a charge trapping layer.

5. The molecular synthesis device according to claim 1, wherein the memory transistor of each bit cell is a ferroelectric transistor.

6. The molecular synthesis device according to claim 1, further comprising a substrate, wherein the non-volatile memory is formed on the substrate and the synthesis array is formed on the non-volatile memory.

7. The molecular synthesis device according to claim 6, wherein each memory transistor comprises a vertical channel formed in a semiconductor structure protruding vertically from the substrate, and wherein the first source/drain terminal of each memory transistor is arranged above the vertical channel.

8. The molecular synthesis device according to claim 6, wherein the electrode at each synthesis location is connected to the first source/drain terminal of the corresponding bit cell of the non-volatile memory by a via.

9. The molecular synthesis device according to claim 1, wherein the electrode at each synthesis location is an electrode configured to, in response to being enabled: supply heat to generate bubbles, supply charge carriers, and/or generate ions at the synthesis location.

10. A method of selectively activating electrodes of an array of synthesis locations, wherein the electrode of each synthesis location is connected to a first source/drain terminal of a non-volatile memory transistor of a corresponding bit cell of an array of bit cells of a non-volatile memory device, and wherein the memory transistor of each bit cell is switchable between a low threshold voltage and a high threshold voltage and has a control gate connected to a wordline of a set of wordlines of the non-volatile memory device and a second source/drain terminal connected to a bitline of a set of bitlines of the non-volatile memory device, the method comprising:
   setting the memory transistors of each bit cells, connected to electrodes which are to be enabled, to the low threshold voltage and the memory transistors of all other bit cells to the high threshold voltage; and
   applying a control voltage, intermediate between the low and the high threshold voltages, to the wordlines and an electrode voltage to the bitlines.

11. The method according to claim 10, wherein the non-volatile memory is a NOR flash memory and the method comprises:
   performing a Fowler-Nordheim tunneling erase on each bit cells of the non-volatile memory where the memory transistors of the bit cells are set to the low threshold voltage; and
   setting the memory transistors of all other bit cells to the high threshold voltage by Fowler-Nordheim tunneling or channel hot electron injection.

12. The molecular synthesis device according to claim 3, wherein bit cells of the array of the non-volatile memory arranged in a same array column are connected to a same bitline, and wherein bit cells of the array of the non-volatile memory arranged in a same array row are connected to a same wordline.

13. The molecular synthesis device according to claim 9, wherein the non-volatile memory is a NOR flash memory.

14. The molecular synthesis device according to claim 9, wherein the memory transistor of each bit cell includes a floating gate or a charge trapping layer.

15. The molecular synthesis device according to claim 9, wherein the memory transistor of each bit cell is a ferroelectric transistor.

16. The molecular synthesis device according to claim 7, wherein the electrode at each synthesis location is connected to the first source/drain terminal of the corresponding bit cell of the non-volatile memory by a via.

17. The molecular synthesis device according to claim 8, wherein the electrode at each synthesis location is an electrode configured to, in response to being enabled: supply heat to generate bubbles, supply charge carriers, and/or generate ions at the synthesis location.

18. The molecular synthesis device according to claim 2, wherein the electrode at each synthesis location is an electrode configured to, in response to being enabled: supply heat to generate bubbles, supply charge carriers, and/or generate ions at the synthesis location.

19. The molecular synthesis device according to claim 1, wherein the array of synthesis locations are arranged in reaction wells configured to contain molecular synthesis reagents, and wherein the electrode at each synthesis location is configured to control molecular synthesis in the corresponding reaction well.

20. The molecular synthesis device according to claim 1, further comprising fluidic channels configured to supply, to the array of synthesis locations, molecular synthesis reagents for synthesizing polymers comprising at least two types of monomers.

21. The molecular synthesis device according to claim 1, wherein the electrode at each synthesis location is an electrode configured to, in response to being enabled: supply thermal energy or electrical bias.

22. The molecular synthesis device according to claim 1, wherein the magnitude of the electrode voltage depends on the type of molecular synthesis reaction configured to occur at the respective synthesis location.

* * * * *